(12) United States Patent
Benjaram et al.

(10) Patent No.: US 11,722,802 B2
(45) Date of Patent: *Aug. 8, 2023

(54) IMAGING SYSTEMS WITH ADJUSTABLE AMPLIFIER CIRCUITRY

(71) Applicant: SEMICONDUCTOR COMPONENTS INDUSTRIES, LLC, Phoenix, AZ (US)

(72) Inventors: Rajashekar Benjaram, Banaglore (IN); Gurvinder Singh, Bangalore (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/818,436

(22) Filed: Aug. 9, 2022

(65) Prior Publication Data

US 2022/0385847 A1 Dec. 1, 2022

Related U.S. Application Data

(63) Continuation of application No. 16/947,604, filed on Aug. 10, 2020, now Pat. No. 11,445,140.

(30) Foreign Application Priority Data

Aug. 30, 2019 (IN) .............................. 201911035058

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14612* (2013.01); *H04N 25/50* (2023.01);
(Continued)

(58) Field of Classification Search
CPC ...... H04N 5/378; H04N 5/351; H04N 5/3698; H04N 5/3745; H04N 5/37457;
(Continued)

(56) References Cited

U.S. PATENT DOCUMENTS 9,264,643 B1* 2/2016 Xue ...................... H04N 5/3575
2010/0002114 A1* 1/2010 Ogura .................... H04N 5/365
348/301

(Continued)

*Primary Examiner* — Shahbaz Nazrul
(74) *Attorney, Agent, or Firm* — Treyz Law Group, P.C.; Tianyi He

(57) ABSTRACT

An image sensor may include an array of image pixels. The array of image pixel may be coupled to column readout circuitry. A given image pixel may generate a low light signal and a high light signal for a given exposure. A column line may couple the given image pixel to readout circuitry having amplifier circuitry. The column line may be coupled to an autozeroing transistor for reading out the high light signal and a source follower stage for readout out the low light signal. The amplifier circuitry may receive different common mode voltage depending on whether it is amplifying the low or high light signal. The gain and other operating parameters of the amplifier circuitry may be adjusted based on whether it is amplifying the low or high signal. If desired, separate amplifier circuitry may be implemented for the low and high light signals.

20 Claims, 6 Drawing Sheets

(51) Int. Cl.
  *H04N 25/50* (2023.01)
  *H04N 25/77* (2023.01)
  *H04N 25/709* (2023.01)
  *H04N 25/778* (2023.01)

(52) U.S. Cl.
  CPC ........... *H04N 25/709* (2023.01); *H04N 25/77* (2023.01); *H04N 25/778* (2023.01)

(58) Field of Classification Search
  CPC ...... H04N 25/75; H04N 25/50; H04N 25/709; H04N 25/77; H04N 25/778; H01L 27/14612
  See application file for complete search history.

(56) References Cited

U.S. PATENT DOCUMENTS

| | | | |
|---|---|---|---|
| 2018/0054576 A1* | 2/2018 | Otaka | H04N 5/3559 |
| 2019/0098242 A1* | 3/2019 | Mori | H04N 5/379 |
| 2020/0236318 A1* | 7/2020 | Okura | H04N 5/35527 |
| 2020/0260035 A1* | 8/2020 | Luong | H04N 5/357 |
| 2020/0265909 A1* | 8/2020 | Matsuura | H04N 5/378 |

\* cited by examiner

IMAGING SYSTEMS WITH ADJUSTABLE AMPLIFIER CIRCUITRY

This application is a continuation of U.S. patent application Ser. No. 16/947,604 filed on Aug. 10, 2020, which claims the benefit of and claims priority to Indian patent application No. 201911035058, filed on Aug. 30, 2019. These two applications are hereby incorporated by reference herein in their entireties.

BACKGROUND

This relates generally to imaging devices, and more particularly, to readout circuitry in image sensors.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Typically, each image pixel contains a photodiode for generating charge in response to incident light. Each image pixel can generate charge in varying light conditions, such as in a relatively low light condition or in a relatively high light condition. As such, in some applications, it may be desirable for the image pixel generate signals that optimize for these varying light conditions, e.g., a low light signal and a high light signal. Additionally, the differing characteristics between the low light signal and the high light signal (e.g., the different types of dominant noise between the low light signal and the high light signal) may provide an opportunity to more efficiently adjust and configure readout circuitry for reading out each of these two signals.

It would therefore be desirable to provide imaging systems with improved readout circuitry (e.g., for reading out the low light signal with low read noise and higher settling accuracy, for reading out the high light signal more quickly while lowering power consumption).

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
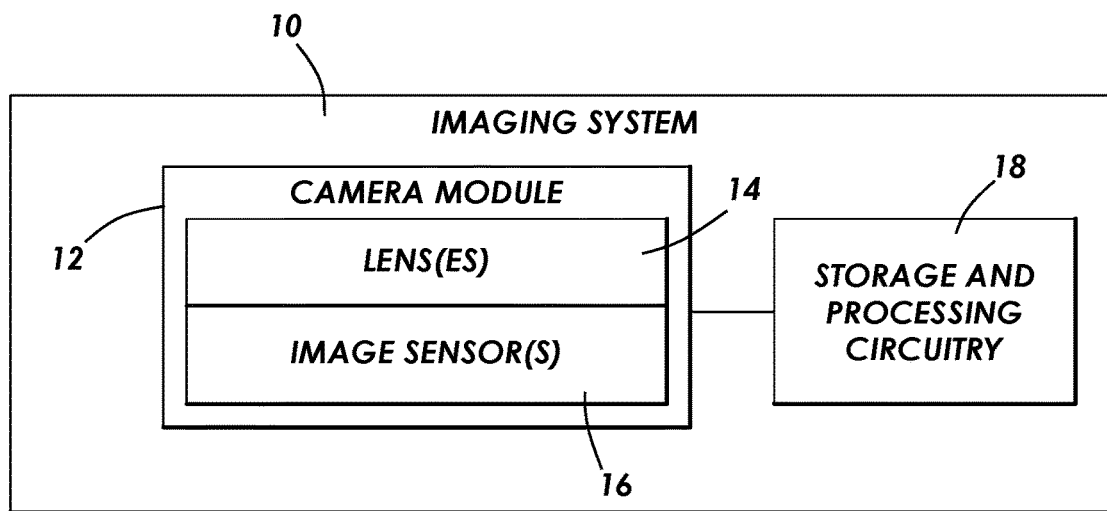
FIG. 1 is a diagram of an illustrative electronic device having an image sensor and processing circuitry for capturing images in accordance with some embodiments.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, an augmented reality and/or virtual reality system, an unmanned aerial vehicle system (e.g., a drone), an industrial system, or any other desired imaging system or device that captures digital image data. Camera module 12 (sometimes referred to as an imaging module) may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16 and other macro lenses. During image capture operations, light from a scene may be focused onto image sensor 16 by lenses 14. Image sensor 16 may include circuitry for converting analog pixel image signals into corresponding digital image data that is provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from the camera module and/or that form part of the camera module (e.g., circuits that form part of an integrated circuit that includes image sensors 16 or an integrated circuit within the module that is associated with image sensors 16). When storage and processing circuitry 18 is included on different integrated circuits (e.g., chips) than those of image sensors 16, the integrated circuits with circuitry 18 may be vertically stacked or packaged with respect to the integrated circuits with image sensors 16. Image data that has been captured by the camera module may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, an external display, or other devices) using wired and/or wireless communications paths coupled to processing circuitry 18.

Figure 2:
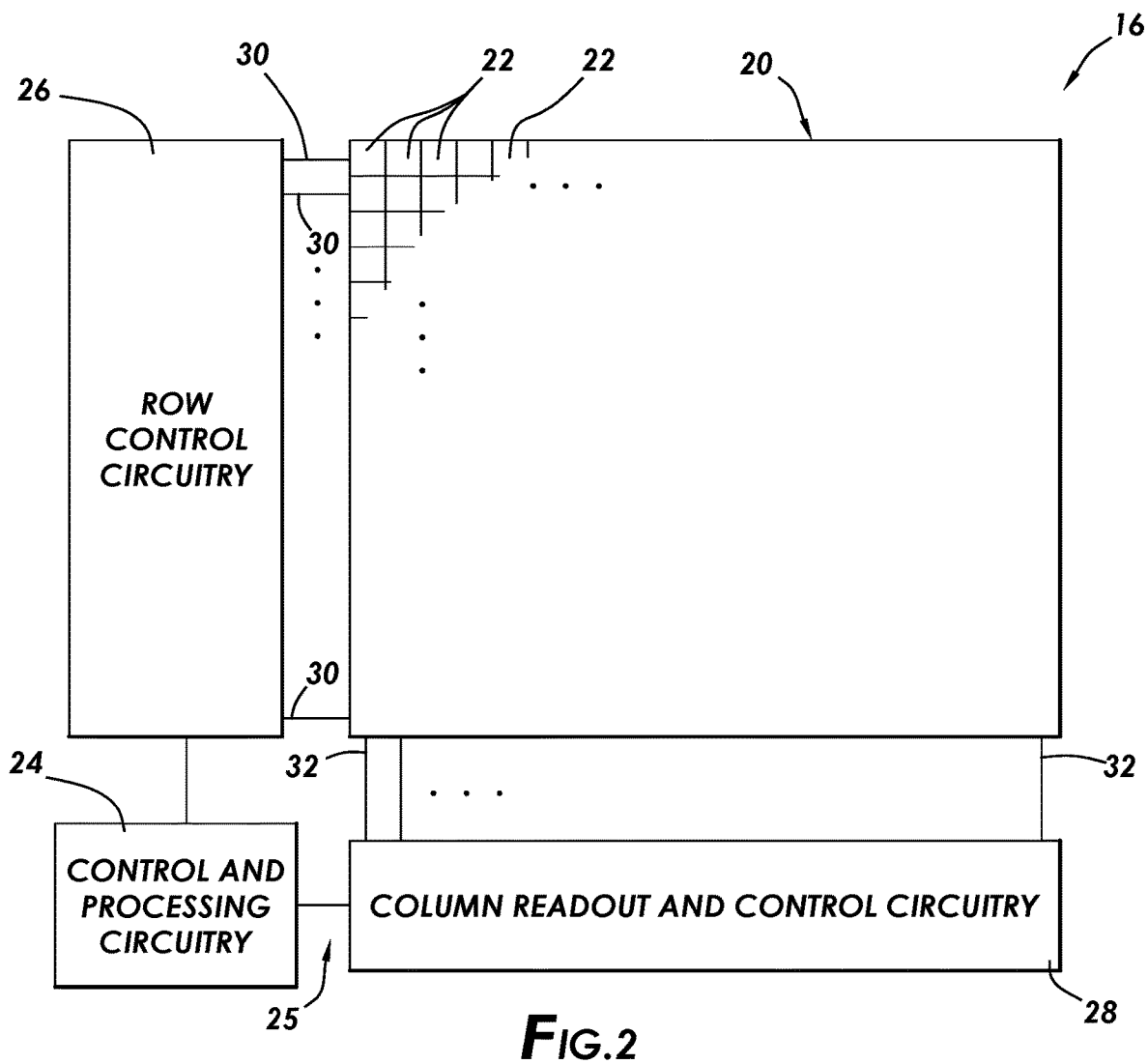
FIG. 2 is a diagram of an illustrative pixel array and associated control and readout circuitry for controlling the pixel array and reading out image signals from the pixel array in accordance with some embodiments.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 (sometimes referred to as row driver circuitry or row drivers) and column readout circuitry 28 (sometimes referred to as column control circuitry, image readout circuitry, readout circuitry, processing circuitry, or column decoder circuitry). Row control circuitry 26 may receive row addresses from control circuitry 24 and supply corresponding row control signals such as reset, anti-blooming, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Column readout circuitry 28 may receive image signals (e.g., analog pixel values generated by pixels 22) over column lines 32. Column readout circuitry 28 may include memory circuitry for temporarily storing calibration signals (e.g., reset level signals, reference level signals) and/or image signals (e.g., image level signals) read out from array 20, amplifier circuitry or a multiplier circuit, analog to digital conversion (ADC) circuitry, bias circuitry, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Column readout circuitry 28 may supply digital pixel data to control and processing circuitry 24 and/or processor 18 (FIG. 1) for pixels in one or more pixel columns.

If desired, image pixels 22 may each include more than one photosensitive region for generating charge in response to image light. Photosensitive regions within image pixels 22 may be arranged in rows and columns on array 20. Pixel array 20 may also be provided with a filter array having multiple (color) filter elements (each corresponding to a respective pixel) which allows a single image sensor to sample light of different colors or sets of wavelengths. As an example, image sensor pixels such as the image pixels in array 20 may be provided with a color filter array having red, green, and blue filter elements, which allows a single image sensor to sample red, green, and blue (RGB) light using corresponding red, green, and blue image sensor pixels arranged in a Bayer mosaic pattern.

In another suitable example, the green pixels in a Bayer pattern may be replaced by broadband image pixels having broadband color filter elements (e.g., clear color filter elements, yellow color filter elements, etc.). In yet another example, one of the green pixels in a Bayer pattern may be replaced by infrared (IR) image pixels formed under IR color filter elements and/or the remaining red, green, and blue image pixels may also be sensitive to IR light (e.g., may be formed under filter elements that pass IR light in addition to light of their respective colors). These examples are merely illustrative and, in general, filter elements of any desired color and/or wavelength and in any desired pattern may be formed over any desired number of image pixels 22.

Image sensor 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices technology. Image pixels 22 may be frontside illumination (FSI) image pixels or backside illumination (BSI) image pixels. If desired, image sensor 16 may include an integrated circuit package or other structure in which multiple integrated circuit substrate layers or chips are vertically stacked with respect to each other. In this scenario, one or more of circuitry 24, 26, and 28 may be vertically stacked above or below array 20 within image sensor 16. If desired, lines 32 and 30 may be formed from vertical conductive via structures (e.g., through-silicon vias or TSVs) and/or horizontal interconnect lines in this scenario.

Figure 3:
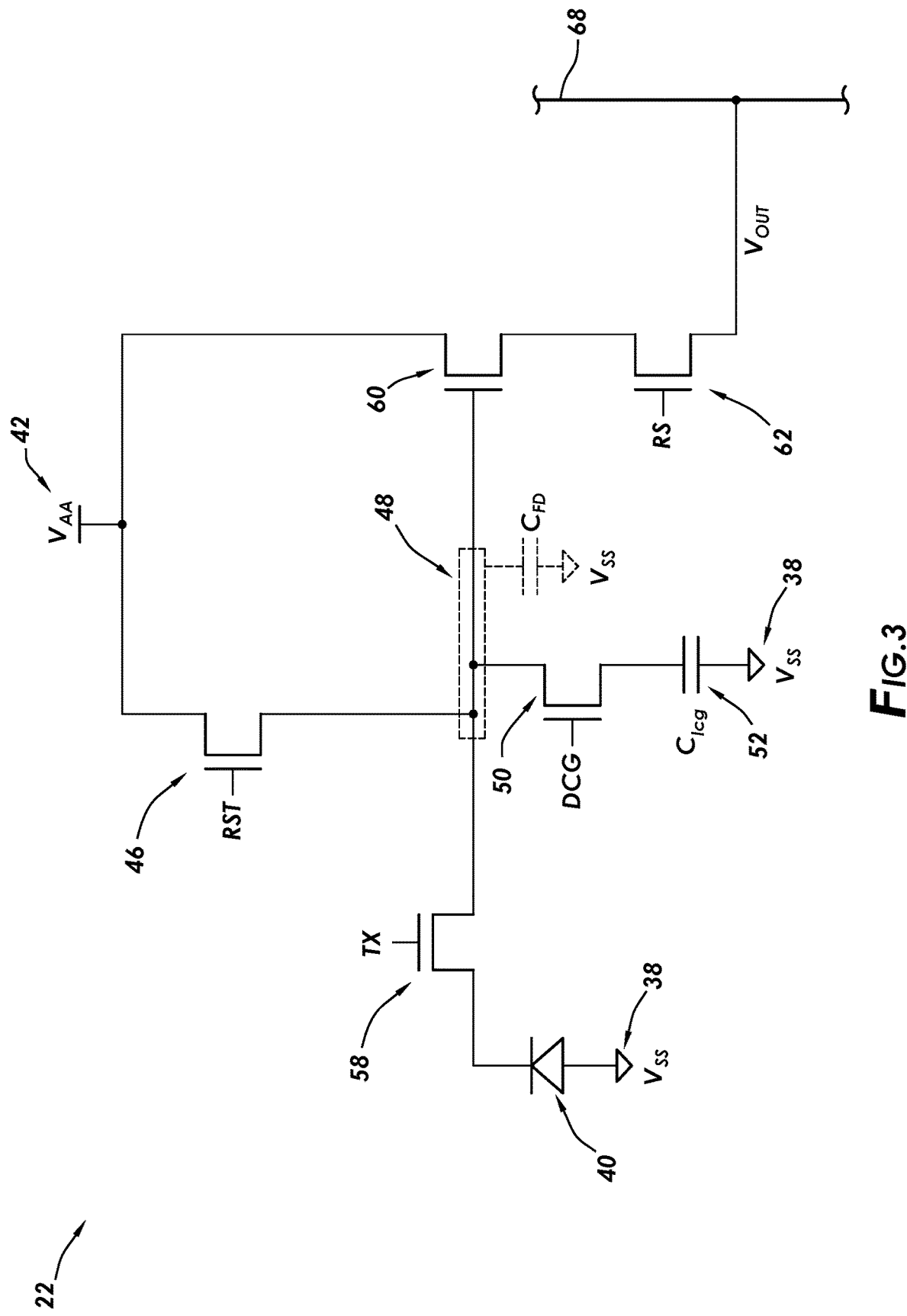
FIG. 3 is a circuit diagram of an illustrative image pixel that can be implemented across a pixel array in accordance with some embodiments.

FIG. 3 is a circuit diagram of an illustrative image pixel 22. As shown in FIG. 3, pixel 22 may include a photosensitive element such as photodiode 40. Photodiode 40 may include a first terminal that receives a reference voltage $V_{SS}$ (e.g., a ground voltage supplied by voltage terminal 38). Incoming light may be collected by photodiode 40. Photodiode 40 may generate charge (e.g., electrons) in response to receiving impinging photons. The amount of charge that is collected by photodiode 40 may depend on the intensity of the impinging light and the exposure duration (or integration time).

A positive power supply voltage $V_{AA}$ may be supplied at voltage terminal 42. Before an image is acquired, reset transistor 46 may be turned on (e.g., by asserting control signal RST) to reset charge storage region 48 (sometimes referred to as a floating diffusion region) to voltage $V_{AA}$. The voltage levels stored at floating diffusion region 48 may be read out using charge readout circuitry in pixel 22. The charge readout circuitry may include source follower transistor 60 and row select transistor 62. The charge stored at charge storage region 48 may include photodiode-generated charge, reset level charge (associated with voltage $V_{AA}$), and/or other reference level charges (e.g., indicative of dark current, parasitic light, etc.).

Photodiode 40 may be reset to power supply voltage $V_{AA}$ (e.g., by connecting voltage terminal 42 to a second terminal of photodiode 40). After photodiode 40 is reset, photodiode 40 may begin to accumulate photo-generated charge. Pixel 22 may include transfer transistor 58. Transfer transistor 58 may be turned on (e.g., by asserting control signal TX) to transfer charge from photodiode 40 to floating diffusion region 48. Floating diffusion region 48 may be a doped semiconductor region (e.g., a region in a silicon substrate that is doped by ion implantation, impurity diffusion, or other doping process). Floating diffusion region 48 may have an associated charge storage capacity (e.g., as shown by capacitance $C_{FD}$ of a capacitor coupled to a reference voltage such as voltage $V_{SS}$ in FIG. 3).

Row select transistor 62 may have a gate terminal that is controlled by a row select signal (i.e., signal RS). When the row select signal is asserted, transistor 62 is turned on and a corresponding signal $V_{OUT}$ (e.g. an output signal having a magnitude that is proportional to the amount of charge at floating diffusion region 48), is passed onto a pixel output path via source follower transistor 60, and passed onto a readout path such as column line 68 (i.e., line 32 in FIG. 2). When floating diffusion region 48 stores photodiode-generated charge that is being read out, the corresponding signal $V_{OUT}$ may be referred to as an image level signal. When floating diffusion region 48 stores reset level charge that is being read out, the corresponding signal $V_{OUT}$ may be referred to as a reset level signal.

An image sensor having an array of image pixels such as pixels 22 in FIG. 3 may operate in varying light conditions (e.g., in a relatively low light environment, in a relatively high light environment, in an intermediate light environment between the low and high light environment, etc.). In some applications (e.g., to provide high dynamic range images), it may be desirable for pixel 22 in FIG. 3 to generate more than one image signal (e.g., two image signals) for each exposure time period.

Still referring to the example of FIG. 3, pixel 22 may include a capacitor such as low (conversion) gain capacitor 52 (e.g., having a capacitance $C_{lcg}$). Capacitor 52 may be configured to store overflow charge (e.g., a portion of the charge generated by photodiode 40 above a voltage threshold, excess charge generated in the high light condition). Capacitor 52 may be coupled to floating diffusion region 48 via a transistor such as dual conversion gain transistor 50. Capacitor 52 may have a terminal that is coupled to a voltage terminal such as voltage terminal 38 providing a ground voltage (or is coupled to any other suitable voltage terminal). Transistor 50 may be activated (e.g., by asserting control signal DCG) to connect capacitor 52 to floating diffusion region 48.

In particular, capacitor 52 may be configured to extend the storage capacity of floating diffusion region 48. Pixel 22 may generate a first signal (e.g., a low light or high conversion gain signal, sometimes referred to herein as an S1 image signal) using charge stored at floating diffusion region 48 (e.g., while capacitor 52 is disconnected from floating diffusion region 48), and may generate a second signal (e.g., a high light or low conversion gain signal, sometimes referred to herein as an S2 image signal) using charge stored at floating diffusion region 48 and capacitor 52 (e.g., while capacitor 52 is connected to floating diffusion region 48).

The pixel configuration shown in FIG. 3 is merely illustrative. Arrangements in which the type of pixel 22 in FIG. 3 is implemented as each of pixels 22 across array 20 in FIG. 2 are described herein as an example. If desired, any suitable modifications may be made to pixel 22 to implement pixel array 20 in FIG. 2. As examples, pixel 22 may include multiple photodiodes (e.g., coupled to the same or different floating diffusion regions), anti-blooming transistors or paths, multiple low conversion gain capacitors coupled to the floating diffusion region(s) via corresponding gain control transistor(s), etc. In general pixel 22 may be In a typical image pixel array configuration, there are numerous rows and columns of pixels 22. A column readout path may be associated with each column of pixels 22 (e.g., each image pixel 22 in a column may be coupled to the column readout path through an associated row select transistor 62). Control signal RS may be asserted to read out signal $V_{OUT}$ from a selected image pixel onto the pixel readout path. Signal $V_{OUT}$ may be provided to readout circuitry 28 (FIG. 2) and processing circuitry 18 (FIG. 1) for further processing.

Figure 4:
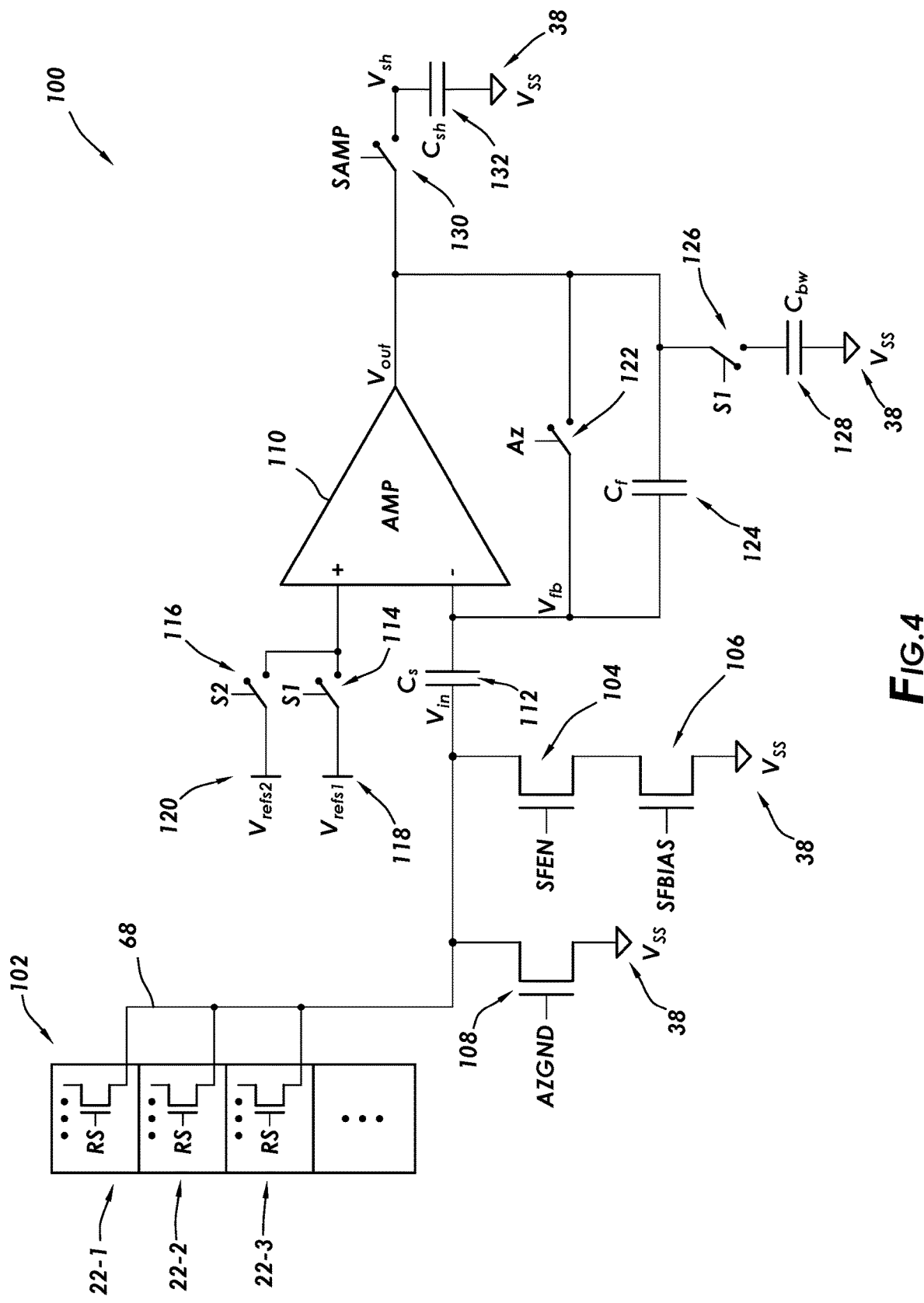
FIG. 4 is a circuit diagram of illustrative readout circuitry coupled to image pixels and having adjustable amplifier circuitry in accordance with some embodiments.

FIG. 4 is a circuit diagram for an illustrative arrangement in which a given one of the pixel columns in the pixel array (e.g., array 20 in FIG. 2) is coupled to readout circuitry. As shown in FIG. 4, pixel column 102 may include pixels 22-1, 22-2, 22-3, etc. (e.g., each having the configuration of pixel 22 in FIG. 3). Each of the pixels 22 in column 102 may include a corresponding row select transistor coupled to a shared column line 68 (e.g., column line 32 in FIG. 2). Column line 68 may couple pixels 22 in column 102 to readout circuitry 100. Readout circuitry 100 may form a portion of column readout circuitry 28 in FIG. 2. As an example, corresponding separate readout circuitry (analogous to readout circuitry 100) may similarly be coupled to other columns of pixels in array 20 and may collectively form column readout circuitry 28.

As described above in connection with FIG. 3, each pixel may generate a high light signal and a low light signal. To more effectively perform readout operations on both the high light signal and the low light signal, an image sensor may include adjustable readout circuitry such as readout circuitry 100 in FIG. 4. In particular, the low light performance of the image sensor (e.g., obtaining a satisfactory low light signal) may emphasize factors such as low readout chain (circuitry) noise, good linearity, and low fixed pattern noise, while the high light performance of the image sensor (e.g., obtaining a satisfactory high light signal) may deemphasize factors such as readout chain noise and settling accuracy since the input signal noise can be more dominant. As such, it may be desirable to relax corresponding readout circuitry parameters for the high light signal to improve sampling time and power consumption. Additionally, the kick back effect of the pixel output on the floating diffusion region can be desirably matched during the high light image and reset level signal readout (e.g., by connecting the column line to a reference or ground voltage prior to readout onto the column line). Configurations of readout circuitry 100 having at least these desirable attributes are described below in further detail.

In particular, readout circuitry 100 may include transistors 104 and 106 coupled in series between column line 68 and a voltage terminal such as voltage terminal 38 supplying a voltage Vss (e.g., a ground voltage). Transistor 104 may serve as a switch that selectively connects column line 68 to transistor 106 (e.g., by asserting control signal SFEN). Bias transistor 106 may be configured to generate a bias current (e.g., by using control signal SFBIAS), which helps drive signals off of pixels 22 in column 102 during readout operations (e.g., for the low light signal).

Readout circuitry 100 may include transistor 108 coupled between column line 68 and a voltage terminal such as voltage terminal 38 supplying voltage Vss (e.g., a ground voltage). Transistor 108 may be configured to pull down the voltage of column line 68 to voltage Vss or any other reference voltage such as a voltage high than a ground voltage (e.g., by asserting control signal AZGND).

Readout circuitry 100 may include amplifier circuitry (e.g., an operational amplifier) such as amplifier circuitry 110. Amplifier circuitry 110 may include a first input terminal (e.g., an inverting terminal) and a second input terminal (e.g., a non-inverting terminal). Column line 68 supplying signal Vin may be coupled to the inverting terminal of amplifier circuitry 110 via an input capacitor such as capacitor 112 having a capacitance Cs.

The non-inverting terminal of amplifier circuitry 110 may receive one of two reference voltages Vrefs1 and Vrefs2. In particular, switch 114 (controlled by control signal S1) may couple reference voltage terminal 118 supplying voltage Vrefs1 to the non-inverting terminal of amplifier circuitry 110. Along a separate path, switch 116 (controlled by control signal S2) may couple reference voltage terminal 120 supplying voltage Vrefs2 to the non-inverting terminal of amplifier circuitry 110. As an example, voltage Vrefs1 may be the lowest possible input common mode voltage able to be received by amplifier 100, while voltage Vrefs2 may be greater than the reset level signal in the pixel output. If desired, Vrefs1 and Vrefs2 may be any other suitable value.

Amplifier circuitry 110 may include an output terminal providing an amplifier output signal Vout. The output terminal of amplifier circuitry 110 may be coupled to the inverting terminal of amplifier circuitry 110 via an auto-zero switch such as switch 122 controlled by signal AZ. Along a separate path (e.g., a second path parallel to the path along which switch 122 is coupled), the output terminal of amplifier circuitry 110 may be coupled to the inverting terminal of amplifier circuitry 110 via a feedback capacitor such as feedback capacitor 124 having a capacitance Cf. A ratio of the input capacitance Cs to the feedback capacitance may determine a gain (factor) G for amplifier circuitry 110 and may be adjustable. As an example, for amplifying the low light signal, the gain may be relatively large (e.g., at least greater than one), while for amplifying the gain may be less than or equal to one.

Additionally, switch 126 may couple the output terminal of amplifier circuitry 110 to voltage terminal 38 (e.g., supplying a ground voltage) via capacitor 128 (e.g., filtering circuitry). Switch 126 may be controlled by control signal S1 (e.g., the same signal received by switch 114). This band limiting path may be used to reduce the read noise (e.g., for the low light signal).

The output terminal of amplifier circuitry 110 may further be connected to sample and hold circuitry (e.g., memory circuitry for storing image level and reset level signals for high light and low light signals). In particular, a sampling switch such as switch 130 controlled by signal SAMP may connect the output terminal of amplifier circuitry to sampling circuitry such as a sample-and-hold capacitor 132 (e.g., storing voltage Vsh at one terminal and receiving at a reference voltage such as a ground voltage at the other terminal).

Readout circuitry 100 may be configured to operate in first and second modes (e.g., in a low light mode in which readout for a low light image level signal and a corresponding reset level signal is performed and in a high light mode in which readout for a low light image level signal and a corresponding reset level signal is performed). Referring to transistor 108 in FIG. 4, control signal AZGND may be selectively asserted during the high light mode (e.g., before column line 68 receives image level and reset level signals for high light). Control signal SFEN may be deasserted during the entirety of the high light mode. These controls may mitigate any memory effects on the column line to match the kick back of the pixel output in during the readout of the image and reset level signals for high light and may reduce sampling time and power consumption during the high light mode operation.

In contrast, control signal AZGND may be deasserted and control signal SFEN may be asserted during the low light mode to provide higher settling accuracy. In other words, during the low light mode, the readout is performed with the source follower stage, and during the high light mode, the readout is performed without the source follower stage. Any non-linearity associated with performing the readout without the source follower stage can be corrected with a piecewise linear correction in the digital domain (e.g., by downstream digital processing circuitry).

During the low light mode (e.g., for the readout of the low light image and reset level signals), control signal S1 may be asserted. During high light mode (e.g., for readout of the high light image and reset level signals), control signal S2 may be asserted. Referring to reference voltage terminals 118 and 120 in FIG. 4 selectively connected to the non-inverting terminal of operational amplifier 110 via switches 114 and 116, a relatively low common mode voltage Vrefs1 may be provided to amplifier circuitry 110 during the low light mode, and a relatively high common mode voltage Vrefs2 may be provided to amplifier circuitry 110 during high light mode. Each of the two common mode voltages Vrefs1 and Vrefs2 may be selected to optimize performance for a corresponding one of the low light signals or high light signals.

Referring to switch 126 and capacitor 128 in FIG. 4, control signal S1 may be asserted during the low light mode. Configured is this manner (e.g., switch 126 being in a closed (i.e., conductive) state, output signal Vout may be band limited during the low light mode, thereby reducing readout noise for the low light signal. During the high light mode, control signal S2 may be deasserted and switch 126 may be in an open state to improve the speed of the readout operation.

Figure 5:
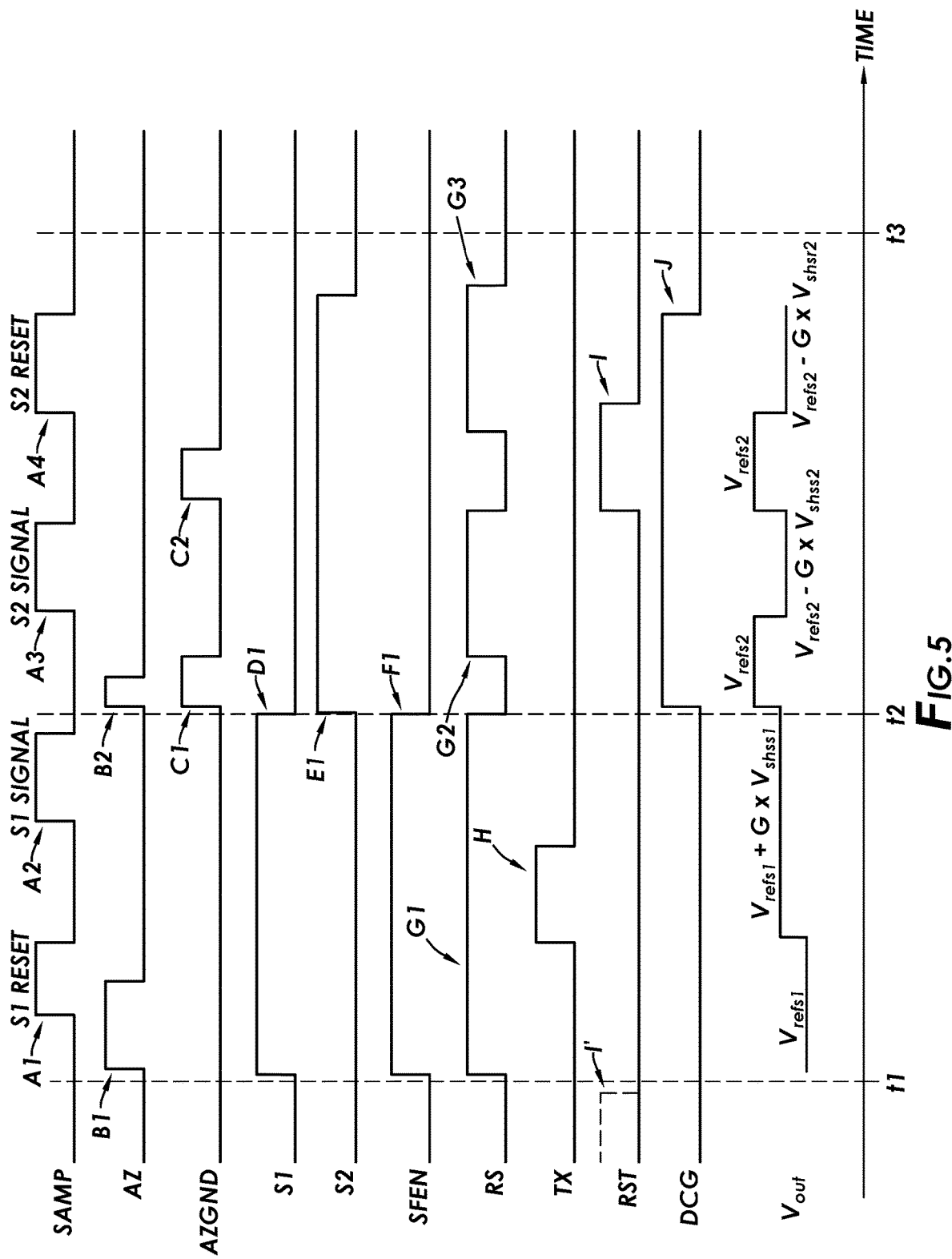
FIG. 5 is an illustrative timing diagram for operating readout circuitry such as the readout circuitry in FIG. 4 and an image pixel such as the image pixel in FIG. 3 in accordance with some embodiments.

FIG. 5 is an illustrative timing diagram for operating adjustable readout circuitry such as readout circuitry 100 in FIG. 4 to readout image level and reset level signals for low light and high light. In particular, the readout circuitry may operate in a low light mode during a time period between times t1 and t2 and may operate in a high light mode during a time period between times t2 and t3. Control circuitry such as control circuitry 24 and/or 26 (FIG. 2) may be configured to provide (e.g., assert and deassert) the control signals described in FIG. 5.

As shown in FIG. 5, between times t1 and t2, a reset level signal and an image level signal for low light may be sampled. In particular, assertions A1 and A2 of control signal SAMP may selectively activate a sampling switch (e.g., switch 130 in FIG. 4) to sample the amplifier output signal (e.g., signal Vout for amplifier circuitry 110 in FIG. 4) corresponding to the reset level signal at assertion A1 and corresponding to the image level signal at assertion A2.

During the time period between t1 and t2, control signal S1 may be (continuously) asserted by assertion D1 (e.g., to activate switch 114 in FIG. 4), thereby providing a first common mode voltage for the low light mode to the amplifier circuitry (e.g., providing the lowest possible common mode voltage Vrefs1 to amplifier circuitry 110 in FIG. 4) and providing a band limiting path (e.g., a connection to capacitor 128 in FIG. 4). During the time period between t1 and t2, control signal SFEN may be (continuously) asserted by assertion F1 (e.g., to activate transistor 104 in FIG. 4), thereby providing a bias current to the column line (e.g., connecting transistor 106 to column line 68 in FIG. 4). During the time period between t1 and t2, control signal RS may be (continuously) asserted by assertion G1 (e.g., to activate transistor 62 in FIG. 3 in a corresponding pixel 22 in column 102 in FIG. 4 for which readout operations is performed), thereby connecting the pixel circuitry (e.g., source follower transistor 60 in FIG. 3) to the corresponding column line.

Prior to performing readout operations on the reset level signal for low light using assertion A1 (e.g., before time t1), the floating diffusion region of the pixel from which the reset level signal is read out may be reset to a supply voltage using assertion I'. The reset level signal may be passed to the amplifier circuitry as input signal Vin (e.g., using assertions F1 and G1 for signals SFEN and RS, respectively). After time t1, control signal AZ may be asserted by assertion B1 to connect the inverting terminal and the output terminal of the amplifier circuitry (e.g., amplifier circuitry 110 in FIG. 4). At this point, amplifier output signal Vout may be at the common mode voltage for low light (e.g., voltage Vrefs1). This amplifier output may be sampled using assertion A1.

Thereafter, control signal TX may be asserted by assertion H to transfer charge generated by a photodiode to the floating diffusion region (in the same pixel from which the reset level signal read). The image level signal for low light (e.g., the S1 image signal) may be passed to the amplifier circuitry as input signal Vin (e.g., using assertions F1 and G1). At this point, amplifier output signal Vout may be increased to a sum of common mode voltage Vrefs1 and a product of gain factor G with a correlated or relative low light image level signal Vshss1. In particular, the gain factor G may be determined by a ratio of the amplifier input capacitance Cs to the amplifier feedback capacitance Cf, and the correlated low light image level signal Vshss1 may be determined by a difference between the absolute low light image level signal (e.g., from a ground voltage) and the absolute low light reset level signal (e.g., from a ground voltage). The amplifier output at this point may be sampled using assertion A2.

At time t2, the readout circuitry may switch to operate in a high light mode from the low light mode. In particular, between times t2 and t3, a reset level signal and an image level signal for high light may be sampled. In particular, assertions A3 and A4 of control signal SAMP may selectively activate a sampling switch (e.g., switch 130 in FIG. 4) to sample the amplifier output signal (e.g., signal Vout for amplifier circuitry 110 in FIG. 4) corresponding to the image level signal at assertion A3 and corresponding to the reset level signal at assertion A4.

During the time period between t2 and t3, control signal S2 may be (continuously) asserted by assertion E1 (e.g., to activate switch 116 in FIG. 4), thereby providing a second common mode voltage for the high light mode to the amplifier circuitry (e.g., providing voltage Vrefs2 a greater than the reset level voltage to amplifier circuitry 110 in FIG. 4). Additionally, during the time period between t2 and t3, control signal DCG may be (continuously) asserted by assertion J to connect the floating diffusion region at the pixel to the low gain capacitor at the pixel (e.g., capacitor 52 in FIG. 3), thereby providing the overflow charge stored at the low gain capacitor for readout. In this manner, the pixel may be configured to generate a low conversion gain image signal (e.g., a high light image level signal).

After time t2, control signal AZGND may be asserted by assertion C1 to connect the column line to a ground voltage or a different reference voltage (e.g., to connect column line 68 to voltage Vss in FIG. 4). While control signal AZGND is asserted, control signal RS may be deasserted.

After time t2 (e.g., concurrently with assertion C1), control signal AZ may be asserted by assertion B2 to connect the inverting terminal and the output terminal of the amplifier circuitry (e.g., amplifier circuitry 110 in FIG. 4). At this point, amplifier output signal Vout may be at the common mode voltage for high light (e.g., voltage Vrefs2). Thereafter, control signal RS may be asserted by assertion G2 to convey the high light image level signal to the column line (e.g., column line 86 in FIG. 4) and to the inverting terminal of the amplifier circuitry (e.g., amplifier circuitry 110 in FIG. 4).

Accordingly, the amplifier circuitry may generate the amplifier output signal Vout based on the input high light image level signal. In particular, amplifier output signal Vout may decrease from common mode voltage Vrefs2 to a difference between the common mode voltage Verfs2 and a product of gain factor G with the absolute high light image level signal Vshss2 (e.g., from a ground voltage), the gain factor G being determined by a ratio of the amplifier input capacitance Cs to the amplifier feedback capacitance Cf. The gain factor G may be less than or equal to one in the high light mode to avoid saturating the amplifier output. This amplifier output may be sampled using assertion A3.

After assertion A3, control signal AZGND may again be asserted by assertion C2 to connect the column line to a ground voltage (e.g., to connect column line 68 to voltage Vss in FIG. 4). While control signal AZGND is asserted, control signal RS may be deasserted. At this point, amplifier output signal Vout may again be at the common mode voltage for high light (e.g., voltage Vrefs2).

After assertion A3 (e.g., currently with assertion C2), control signal RST may be asserted by assertion I to reset the floating diffusion region of the pixel to a supply voltage (e.g., voltage $V_{AA}$ in FIG. 3). Thereafter, control signal RS may be asserted by assertion G3 to convey the high light reset level signal to the column line (e.g., column line 86 in FIG. 4) and to the inverting terminal of the amplifier circuitry (e.g., amplifier circuitry 110 in FIG. 4).

Accordingly, the amplifier circuitry may generate the amplifier output signal Vout based on the input high light reset level signal. In particular, amplifier output signal Vout may decrease from common mode voltage Vrefs2 to a difference between the common mode voltage Verfs2 and a product of gain factor G with the absolute high light image level signal Vshrs2 (from a ground voltage), the gain factor G being determined by a ratio of the amplifier input capacitance Cs to the amplifier feedback capacitance Cf. This amplifier output may be sampled using assertion A4.

The readout circuitry and timing diagram for operating the readout circuitry described in connection with FIGS. 4 and 5 are merely illustrative. If desired, any suitable modification may be made to the configuration of the readout circuitry and the timing diagram in FIGS. 4 and 5. As an example, FIG. 6 is a circuit diagram of illustrative adjustable readout circuitry having separate amplifier circuitry.

Figure 6:
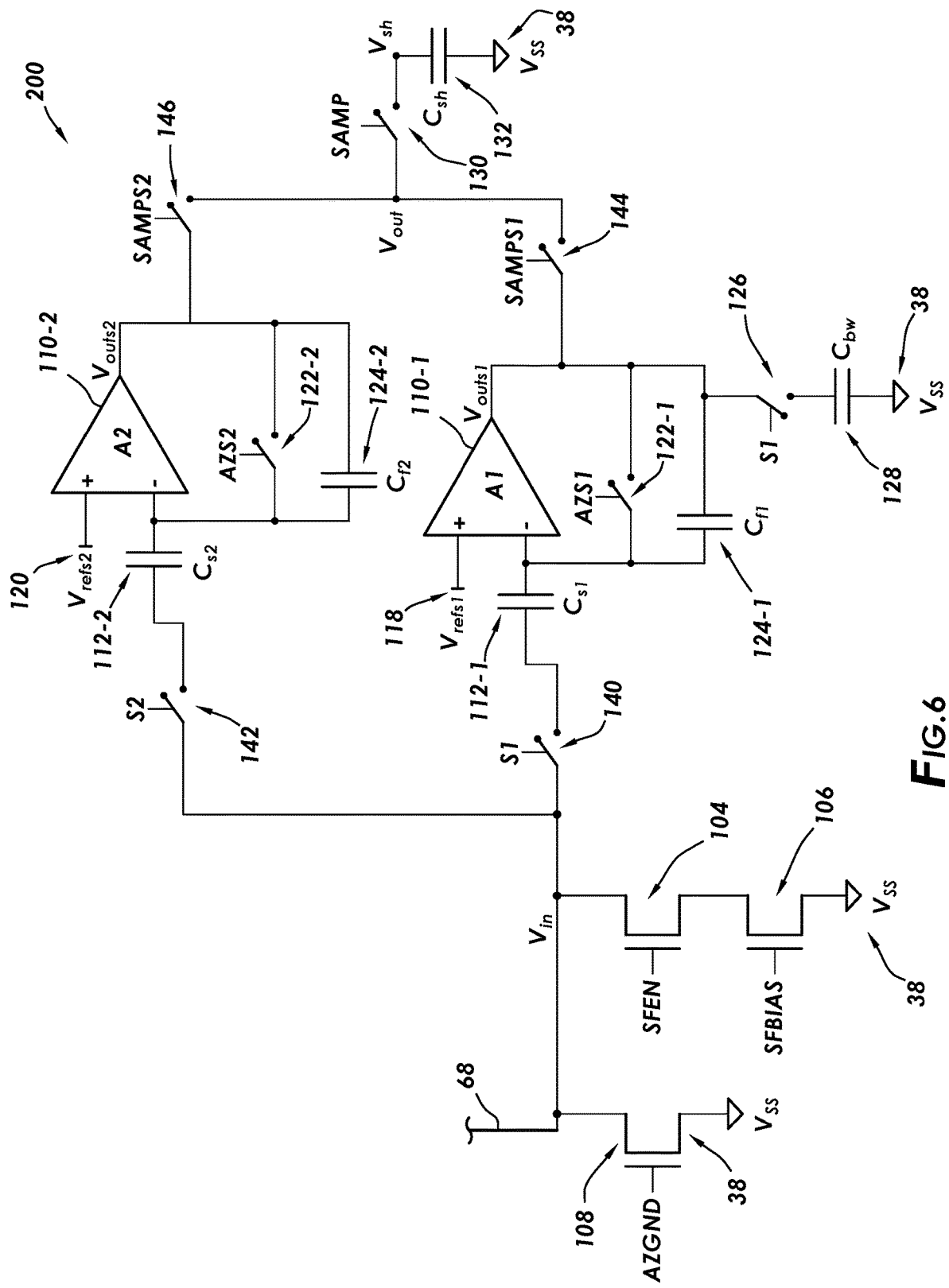
FIG. 6 is a circuit diagram of illustrative readout circuitry having separate amplifier circuitry for image signals of different types in accordance with some embodiments.

As shown in FIG. 6, readout circuitry 200 may include some of the same (or similar) elements implemented in the same (or similar) configurations as elements in readout circuitry 100 in FIG. 4. In order to not unnecessarily obscure the embodiments of FIG. 6, further description for these similar elements and their similar configurations are omitted. These similar elements may have similar functions, configurations, modes of operation, etc. as previously described (e.g., in connection with FIG. 4) unless otherwise specified.

In particular, readout circuitry 200 may include two separate amplifier circuitry 110-1 and 110-2. Whereas amplifier circuitry 110 in FIG. 4 is used to amplify both the low light signal and the high light signal, amplifier circuitry 110-1 may be dedicated for the low light signal, and amplifier circuitry 110-2 may be dedicated for the high light signal. Amplifier circuitry 110-1 and 110-2 may be coupled to column line 68 via respective switches 140 and 142 controlled by control signals S1 and S2, respectively. Amplifier circuitry 110-1 and 110-2 may be coupled to sample and hold circuitry (e.g., the sampling switch) via respective switches 144 and 146 controlled by control signals SAMPS1 and SAMPS2, respectively. Configured in such as a manner, a corresponding amplifier input signal Vin may be selectively provided to one of amplifier circuitry 110-1 or 110-2, and the corresponding amplifier output signal (e.g., signals Vouts1 or Vouts2) may be provided to the sample and hold circuitry.

Each of amplifier circuitry 110-1 and 110-2 may have a corresponding input capacitor (e.g., capacitor 112-1 having capacitance Cs1 or capacitor 112-2 having capacitance Cs2), a corresponding autozero switch (e.g., switch 122-1 controlled by signal AZS1 or switch 122-2 controlled by signal AZS2), and a corresponding feedback capacitor (e.g., capacitor 124-1 having capacitance Cf1 or capacitor 124-2 having capacitance Cf2). Additionally, because the low light signal (and the high light signal) is band limited, switch 126 and capacitor 128 may be coupled to amplifier circuitry 110-1 and not amplifier circuitry 110-2.

Each of amplifier circuitry 110-1 and 110-2 may receive a corresponding common mode voltage at its non-inverting input terminal. In other words, common mode voltage Vrefs1 supplied by terminal 118 may be provided to amplifier circuitry 110-1, and common mode voltage Verfs2 supplied by terminal 120 may be provided to amplifier circuitry 110-2. As such, the amplifier circuitry in FIG. 4 may desirably avoid switching between different common mode voltages.

Because separate amplifier circuitry is provided, the parameters for operating or configuring the amplifier circuitry may be optimized for amplifying either the low light signal (in the case of amplifier circuitry 110-1) or the low light signal (in the case of amplifier circuitry 110-2). In particular, amplifier circuitry 110-1 may optimize for low noise and high bandwidth, whereas amplifier circuitry 110-2 may optimize for low power and high swing.

Figure 7:
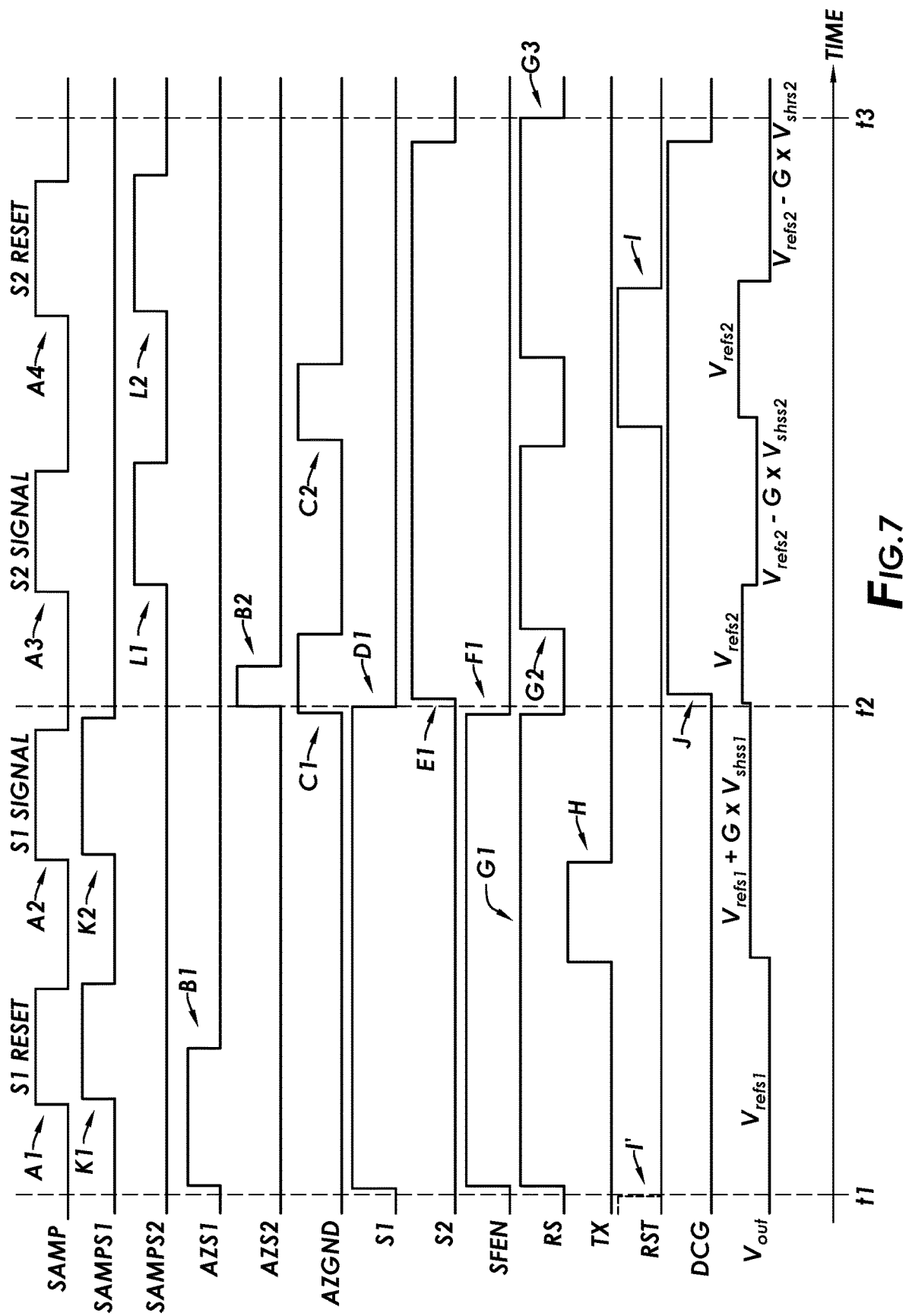
FIG. 7 is an illustrative timing diagram for operation readout circuitry such as the readout circuitry in FIG. 6 and an image pixel such as the image pixel in FIG. 3 in accordance with some embodiments.

FIG. 7 is an illustrative timing diagram for operating adjustable readout circuitry such as readout circuitry 200 in FIG. 6 to readout image level and reset level signals for low light and high light. In particular, the readout circuitry may operate in a low light mode during a time period between times t1 and t2 and may operate in a high light mode during a time period between times t2 and t3. Control circuitry such as control circuitry 24 and/or 26 (FIG. 2) may be configured to provide (e.g., assert and deassert) the control signals described in FIG. 7.

As shown in FIG. 7, the timing diagram may include some of the same (or similar) assertions and deassertions implemented in the same (or similar) manner as those in the timing diagram in FIG. 5. In order to not unnecessarily obscure the embodiments of FIG. 7, further description for these similar elements are omitted. These similar elements may have similar functions, configurations, modes of operation, etc. as previously described (e.g., in connection with FIG. 5) unless otherwise specified.

In a dual-amplifier circuitry configuration (e.g., a dual operational amplifier configuration), assertions of control signal SAMP for sampling the amplifier output may be asserted in conjunction with one of control signals SAMPS1 and SAMPS2 depending on which of the amplifier circuitry is providing the output. As an example, during the low light mode of operation between times t1 and t2, amplifier circuitry 110-1 (FIG. 6) may be active, and control signal SAMPS1 accessing the output of amplifier circuitry 110-1 may be asserted by assertions K1 and K2 concurrently with assertions A1 and A2, respectively. As another example, during the high light mode of operation between times t2 and t3, amplifier circuitry 110-2 (FIG. 6) may be active, and control signal SAMPS2 accessing the output of amplifier circuitry 110-2 may be asserted by assertions L1 and L2 concurrently with assertions A3 and A4, respectively.

Additionally, the assertions for autozeroing the amplifier input and output terminals may also be separated in the dual-amplifier circuitry configuration. As shown in FIG. 7, control signal AZS1 may be asserted by assertion B1 when amplifier circuitry 110-1 is active and control signal AZS2 may be asserted by assertion B2 when amplifier circuitry 110-2 is active.

The functions and operations of the dual amplifier circuitry configuration
 remains largely unchanged relative to those of the single amplifier circuitry configuration. While the dual amplifier circuitry configuration requires additional area to implement, it can provide more advantageous performance due to the more optimized amplifier circuitry among other features.

The readout circuitry and timing diagram for operating the readout circuitry described in connection with FIGS. 6 and 7 are merely illustrative. If desired, any suitable modification may be made to the configuration of the readout circuitry and the timing diagram in FIGS. 6 and 7.

Although arrangements in which the readout circuitry (e.g., in FIG. 4 or FIG. 6) is configured to readout and/or amplify high and low light signals, these arrangements are merely illustrative. If desired, these amplifier circuitry multiplexing schemes may generally be applied to any suitable differing types of signals. If desired, these amplifier circuitry multiplexing schemes (e.g., using two sets of operating modes or amplifier settings or using a number of operating settings corresponding to a number of different signals) may be applied to more than two types of signals as described herein (e.g., may be applied to high light, intermediate light, low light signals, four different types of signals, etc.).

Various embodiments have been described illustrating systems and methods for efficiently performing readout operations.

As an example, an image sensor may include an image sensor pixel array having an image pixel. Readout circuitry may be coupled to the image pixel via a pixel readout path. The readout circuitry may include: amplifier circuitry having a first input terminal coupled to the pixel readout path and a second input terminal configured to receive a first common mode voltage or a second common mode voltage; a first transistor coupling the pixel readout path to a reference voltage terminal; a second transistor coupling the pixel readout path to a bias transistor configured to generate a bias current; a first switch coupling the second input terminal to a first voltage terminal supplying the first common mode voltage; a second switch coupling the second input terminal to a second voltage terminal supplying the second common mode voltage; a sampling switch coupling an output terminal of the amplifier circuitry to sampling circuitry (e.g., a sampling capacitor). The first input terminal may be coupled to the pixel readout path via an input capacitor, the first input terminal may be coupled to the output terminal via an autozero switch along a first path, the first input terminal may be coupled to the output terminal via a feedback capacitor along a second path, and the output terminal of the amplifier circuitry may be coupled to an additional capacitor via an additional switch. The first switch and the additional switch may be configured to receive a same control signal.

If desired, the reference voltage terminal may be configured to supply a ground voltage. If desired, the reference voltage terminal may be configured to supply a voltage that is greater than the ground voltage.

As another example, an image sensor may include: image pixels arranged in columns and rows; column readout circuitry having amplifier circuitry; and control circuitry. A given column of image pixels may be coupled to the amplifier circuitry via a column line, and the column readout circuitry may be configured to read out a low light image signal from a given image pixel in the given column during a first mode of operation and a high light image signal from the given image pixel during a second mode of operation. The control circuitry may be configured to control the readout circuitry to provide the amplifier circuitry with a first common mode voltage during the first mode of operation and provide the amplifier circuitry with a second common mode voltage that is larger than the first common mode voltage during the second mode of operation. The column readout circuitry may include a first transistor coupling the column line to a reference voltage terminal, and the control circuitry may be configured to activate the first transistor during the second mode of operation and deactivate the first transistor during the first mode of operation. The column readout circuitry may include a second transistor coupling the column line to a bias transistor, and the control circuitry may be configured to activate the second transistor during the first mode of operation and deactivate the second transistor during the second mode of operation.

If desired, the amplifier circuitry may include a non-inverting input terminal coupled to a first voltage terminal supplying the first common mode voltage via a first switch and coupled to a second voltage terminal supplying the second common mode voltage via a second switch. The control circuitry may be configured to control the readout circuitry to provide the amplifier circuitry with the first common mode voltage by asserting a first control signal received by the first switch and is configured to control the readout circuitry to provide the amplifier circuitry with the second common mode voltage by asserting a second control signal received by the second switch. The column readout circuitry may include a third switch coupling an output terminal of the amplifier circuitry to a bandwidth capacitor, and the control circuitry may be configured to close the third switch during the first mode of operation and to open the third switch during the second mode of operation. The third switch may be configured to receive the first control signal.

As yet another example, an image sensor may include: an image sensor pixel array having an image pixel; and readout circuitry coupled to the image pixel via a pixel readout path. The readout circuitry may include: first amplifier circuitry having a first input terminal coupled to the pixel readout path via a first switch and having a second input terminal configured to receive a first common mode voltage; second amplifier circuitry having a first input terminal coupled to the pixel readout path via a second switch and having a second input terminal configured to receive a second common mode voltage;

a first transistor coupling the pixel readout path to a reference voltage terminal; a second transistor coupling the pixel readout path to a bias transistor configured to generate a bias current; sampling circuitry coupled to an output terminal of the first amplifier circuitry via a third switch and coupled to an output terminal of the second amplifier circuitry via a fourth switch; and a fifth switch coupling the output terminal of the amplifier circuitry to a bandwidth capacitor.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising:
an image sensor pixel array having an image sensor pixel;
an amplifier having a first input terminal coupled to the image sensor pixel via a pixel readout path and having a second input terminal;
a first reference voltage terminal providing a first reference voltage to the second input terminal via a given node of the second input terminal;
a second reference voltage terminal providing a second reference voltage to the second input terminal via the given node of the second input terminal;
a first transistor coupled to the pixel readout path; and
a second transistor coupled to the pixel readout path.

2. The image sensor defined in claim 1 further comprising:
a third reference voltage terminal providing a third reference voltage, wherein the first transistor couples the pixel readout path to the third reference voltage terminal.

3. The image sensor defined in claim 2, wherein the third reference voltage is a ground voltage.

4. The image sensor defined in claim 3, wherein the first and second reference voltages are each different than the ground voltage.

5. The image sensor defined in claim 1 further comprising:
a third transistor coupled in series with the second transistor.

6. The image sensor defined in claim 1 further comprising:
a first switch coupling the second input terminal to the first reference voltage terminal; and
a second switch coupling the second input terminal to the second reference voltage terminal.

7. The image sensor defined in claim 1 further comprising:
an input capacitor coupled along the pixel readout path.

8. The image sensor defined in claim 7, wherein the input capacitor has a first terminal coupled to the first input terminal of the amplifier and has a second terminal coupled to the first transistor and to the second transistor.

9. The image sensor defined in claim 7, wherein the amplifier has an output terminal coupled to the first input terminal of the amplifier by a feedback capacitor.

10. The image sensor defined in claim 9, wherein the output terminal of the amplifier is coupled to an additional capacitor via a switch.

11. The image sensor defined in claim 9, wherein the amplifier has an output terminal coupled to the first input terminal of the amplifier by a switch.

12. The image sensor defined in claim 9 further comprising:
sampling circuitry; and
a sampling switch coupling the output terminal of the amplifier circuitry to the sampling circuitry.

13. The image sensor defined in claim 1 further comprising:
a first switch coupling the second input terminal to the first reference voltage terminal, wherein the amplifier has an output terminal is coupled to a capacitor via an additional switch and the first switch and the additional switch are controlled by a same control signal.

14. The image sensor defined in claim 1, wherein the image sensor pixel array is arranged in a plurality of columns, a given column in the plurality of columns containing the image sensor pixel and additional image sensor pixels, and the amplifier is disposed within column readout circuitry coupled to the given column in the image sensor pixel array.

15. An image sensor comprising:
image pixels arranged in columns and rows; and
column readout circuitry having an amplifier, wherein a given column of image pixels is coupled to a first input terminal of the amplifier via a column line, wherein a second input terminal of the amplifier is coupled to a first reference voltage terminal by a first switch and is coupled to a second reference voltage terminal by a second switch, and wherein the first and second reference voltage terminals are coupled to a same node of the second input terminal by the first and second switches, respectively.

16. The image sensor defined in claim 15, wherein the second input terminal of the amplifier is configured to receive a first reference voltage from the first reference voltage terminal to perform a readout operation for a first image signal from a given image pixel in the given column.

17. The image sensor defined in claim 16, wherein the second input terminal of the amplifier is configured to receive a second reference voltage from the second reference voltage terminal to perform a readout operation for a second image signal from the given image pixel.

18. The image sensor defined in claim 17, wherein the column readout circuitry includes a transistor coupled to the column line and through which a bias current is provided, and wherein the transistor is configured to be activated for the readout operation for the first image signal and deactivated for the readout operation for the second image signal.

19. Pixel readout circuitry for an image sensor, the pixel readout circuitry comprising:

a first amplifier having a first input terminal configured to be coupled to an image sensor pixel via a first switch and having a second input terminal configured to receive a first reference voltage; and a second amplifier having a first input terminal configured to be coupled to the image sensor pixel via a second switch and having a second input terminal configured to receive a second reference voltage greater than the first reference voltage.

20. The pixel readout circuitry defined in claim 19 further comprising:

a first transistor configured to couple the image sensor pixel to a reference voltage terminal; and a second transistor configured to couple the image sensor pixel to a bias current source.

\* \* \* \* \*